(12) United States Patent
Chen et al.

(10) Patent No.: US 11,773,005 B2
(45) Date of Patent: Oct. 3, 2023

(54) COATINGS FOR GLASS MOLDING, PREPARATION METHOD AND APPLICATION THEREOF AND MOLDS HAVING COATINGS

(71) Applicants: No.59 Institute of China Ordnance Industry, Chongqing (CN); Shenzhen University, Guangdong (CN); University of Science and Technology Liaoning, Liaoning (CN)

(72) Inventors: Qiang Chen, Chongqing (CN); Feng Gong, Guangdong (CN); Zhiwen Xie, Liaoning (CN); Kangsen Li, Guangdong (CN); Xinfang Huang, Liaoning (CN); Zhihui Xing, Chongqing (CN)

(73) Assignees: No. 59 Institute of China Ordnance Industry, Chongqing (CN); Shenzhen University, Shenzhen (CN); University of Science and Technology Liaoing, Liaoning (CN)

( * ) Notice: Subject to any disclaimer, the term of this patent is extended or adjusted under 35 U.S.C. 154(b) by 455 days.

(21) Appl. No.: 16/847,568

(22) Filed: Apr. 13, 2020

(65) Prior Publication Data

US 2021/0061702 A1 Mar. 4, 2021

(30) Foreign Application Priority Data

Aug. 29, 2019 (CN) .......................... 201910805364.X (51) Int. Cl.
| | | |
|---|---|---|
| *C03B 40/00* | (2006.01) | |
| *C03B 23/03* | (2006.01) | |
| *C23C 14/02* | (2006.01) | |
| *C23C 14/06* | (2006.01) | |
| *C04B 41/50* | (2006.01) | |
| *C04B 41/51* | (2006.01) | |
| *C03C 17/22* | (2006.01) | |

(52) U.S. Cl.
CPC .............. *C03B 40/00* (2013.01); *C03B 23/03* (2013.01); *C03C 17/225* (2013.01); *C04B 41/5062* (2013.01); *C04B 41/5111* (2013.01); *C23C 14/021* (2013.01); *C23C 14/0641* (2013.01); *C03B 2215/22* (2013.01); *Y10T 428/25* (2015.01)

(58) Field of Classification Search
None
See application file for complete search history.

(56) References Cited

FOREIGN PATENT DOCUMENTS

| | | | |
|---|---|---|---|
| CN | 1399304 A | 2/2003 | |
| CN | 104451655 A | 3/2015 | |
| CN | 106835037 A | 6/2017 | |
| CN | 107142458 A | 9/2017 | |
| JP | H0333022 A | * 2/1991 | ........... C03B 11/085 |

OTHER PUBLICATIONS

Chen et al. (Chemical inertness of Cr—W—N coatings in glass molding, Thin Solid Films, vol. 593, 2015, pp. 102-109, ISSN 0040-6090, https://doi.org/10.1016/j.tsf.2015.09.044. <https://www.sciencedirect.com/science/article/pii/S0040609015009220> (Year: 2015).*

* cited by examiner

*Primary Examiner* — Cheng Yuan Huang (57) ABSTRACT

Disclosed are a coating for glass molding, a preparation method and application thereof and a mold having the coating. The coating includes a nitride layer and nano precious metal particles which are dispersed in the nitride layer. A surface roughness of the coating is 2-12 nm. The preparation method of the coating includes: cleaning a substrate and targets under an inert gas; and under a mixed atmosphere of nitrogen and the inert gas, depositing, with a high-purity W target, a high-purity Cr target and a precious metal inserted Cr target, a Cr intermediate layer, a nitride layer and nano precious metal particles on a surface of the substrate. The coating has good oxidation resistance and excellent anti-adhesion property. Moreover, the coating effectively inhibits the adhesion between the glass body and the mold.

13 Claims, 8 Drawing Sheets

COATINGS FOR GLASS MOLDING, PREPARATION METHOD AND APPLICATION THEREOF AND MOLDS HAVING COATINGS

CROSS-REFERENCE TO RELATED APPLICATIONS

This application claims the benefit of priority from Chinese Patent Application No. 201910805364.X, filed on Aug. 29, 2019. The content of the aforementioned application, including any intervening amendments thereto, is incorporated herein by reference in its entirety.

TECHNICAL FIELD

The application relates to a coating for glass molding, and a preparation method and application thereof, and a precision mold having the coating.

BACKGROUND OF THE INVENTION

Optical glass, which has excellent thermal and chemical stability, high light transmittance, low thermal expansion coefficient, etc., is widely used in many fields, such as aerospace, digital imaging, medical equipment. Conventional processing methods of optical glass components mainly include numerical control cutting and ultra-precision grinding, which cannot process optical glass components with complicated shapes. Moreover, the conventional processing methods have low processing efficiency and high cost, which limits the application of the optical glass components.

Optical glass precision molding technique is to process high-precision optical components, in which the glass is placed into a high-precision mold, and then is directly molded after softened at the high temperature under pressurized and anaerobic conditions. Such technique can mold high-quality optical components with complicated shapes and improve the processing efficiency. However, in the molding process, the mold surface directly contact with the glass, and frictional damage between the glass and the mold is easy to be caused at the high temperature, thereby resulting in the damage of the mold surface and the failure of the molding of the glass components. Research has found that such problem is solved to some extent by preparing a protective layer (such as carbon films, nitride coatings) on the mold surface. However, the carbon film has a relatively short service life, which limits the large-scale application thereof; the nitride coatings are easy to cause adhesion between the glass body and the mold; and the high cost of precious metal coatings limits wide industrial applications thereof. Therefore, it is necessary to develop a glass molding coating which can suppress the adhesion between the glass body and the mold, and has a low cost and a simple preparation process.

SUMMARY OF THE INVENTION

In a first aspect, the present invention aims to provide a coating for glass molding which suppresses an adhesion between the glass body and the mold.

In order to achieve above object, the present invention adopts the following technical solutions.

Provided is a coating for glass molding, comprising a nitride layer and nano precious metal particles which are dispersed in the nitride layer.

In some embodiments, a surface roughness of the coating is 2-12 nm to better inhibit the adhesion of the glass body to the mold.

In some embodiments, the surface roughness of the coating is 3-5 nm to better inhibit the adhesion of the glass body to the mold.

In some embodiments, the nano precious metal particles are selected from Pt, Au, Ir, Pt—Au alloy, Pt—Ir alloy, Au—Ir alloy, Pt—Au—Ir alloy nanoparticles, or a combination thereof.

In some embodiments, in order to reduce the cost of the coating, an atomic percent (at. %) of the nano precious metal particles in the nitride layer including the nano precious metal particles is 1-10%.

In order to improve the overall performance of the coating, the nano precious metal particles are dispersed in a nitride matrix with the microstructure being a columnar crystal.

In some embodiments, the coating has a thickness of 0.8-1.2 μm.

In some embodiments, the coating has a hardness of 15-25 Gpa.

In some embodiments, the coating is a multi-component nanocomposite nitride coating.

In some embodiments, the nitride coating is a $Cr_xW_yN_{(100-x-y)}$ layer, where $15<x<40$, $15<y<40$.

To improve the stability of the coating, a WN layer and a CrN layer of the coating are in a typical alternating nanocomposite multilayer structure.

In a second aspect, the present invention aims to provide a precision molding mold with excellent performance, on which the above coating is provided.

In a third aspect, the present invention provides a high-temperature resistant material comprising the coating of the present invention.

In a fourth aspect, the present invention provides an oxidation-resistance material comprising the coating of the present invention.

In a fifth aspect, the present invention provides an anti-adhesion material comprising the coating of the present invention.

In a sixth aspect, the present invention aims to provide a method for preparing the above coating, which has a low cost and a simple process, comprising the following steps:

1) cleaning a substrate and targets under an inert gas; and 2) under a mixed atmosphere of nitrogen and an inert gas, depositing, with a high-purity W target, a high-purity Cr target and a precious metal inserted Cr target, a Cr intermediate layer, a nitride layer and nano precious metal particles on a surface of the substrate.

Further, in step 1, the inert gas is argon with a flow rate of 100-180 sccm; the substrate and the targets are cleaned by sputter cleaning for 30-120 minutes, and a vacuum degree for the sputter cleaning is 0.2-0.6 Pa.

Further, in the step 1, the sputter cleaning is carried out for the substrate after the substrate is preheated to 200-400° C.

Further, in the step 2, when depositing the Cr intermediate layer, the inert gas is argon with a flow rate of 100~150 sccm; a bias voltage for deposition is −30~−70 V; a time for deposition is 3-8 minutes, and a power for the high-purity Cr target is 4~8 kW. When depositing the nitride layer and the nano precious metal particles, the inert gas is a mixed atmosphere of argon and nitrogen, where flow rates of the argon and the nitrogen both are 60-120 sccm; a bias voltage for deposition is −30~−70 V; a deposition time is 30-60 minutes; a power for the high-purity W target is 2-5 kW, and a power for the precious metal inserted Cr target is 4-8 kW.

Further, a plasma enhanced magnetron sputtering system is adopted for the deposition of the coating, and comprises a magnetron sputtering control center, a vacuum chamber, a rotary frame arranged in the vacuum chamber and targets arranged around the rotary frame. The targets comprise a high-purity W target, a high-purity Cr target, a precious metal inserted Cr target, and a rotary frame for mounting the substrate.

Further, the precious metal inserted Cr target comprises a high-purity Cr target and a precious metal target, and the precious metal target is uniformly inserted at the high-purity Cr target.

Further, during the deposition, the substrate rotates with the rotary frame at a rotation speed of 1-8 rpm.

Further, the precious metal target comprises 6 Pt targets, 6 Au targets and 3 Ir targets, and the precious metal target has a diameter of 20 mm and a thickness of 1 mm.

The present invention has the following beneficial effects. Due to the above technical solutions, the coating prepared by the invention can have a hardness of 15-24.32 GPa, an elastic modulus of 280-413 GPa and a surface roughness of 2-11.73 nm, so it has good oxidation resistance and excellent anti-adhesion property. Moreover, the coating effectively inhibits the adhesion between the glass body and the mold. As observed by the scanning electron microscopy, the cross section of the glass molding coating of the present invention has a growth structure of fine columnar crystals, and the coating is tightly bonded to the substrate, and crystal particles on the surface of the coating are fine and distributed in clusters. As observed by the transmission electron microscope, the WN layer and the CrN layer of the glass molding coating of the present invention are alternately grown, and the nano precious metal particles are uniformly dispersed in the coating. The distribution of elements in the coating is analyzed using the energy spectrometer provided by the scanning electron microscopy, where the distribution of the elements is uniform, and no agglomeration phenomenon occurs. The BK7 optical glass precision molding is carried out using a glass molding mold with the coating of the present invention, where the molding force is 0.5 kN, and a molding temperature is 650° C. After the molding, the mold coating and the morphology and color of the glass surface are observed, where for the coating, no peeling or sticking phenomenon occurs, and the glass element has no color change, and no bubble is generated. In addition, the coating and the preparation method of the present invention are low in cost, and the preparation method thereof is simple.

DETAILED DESCRIPTION OF EMBODIMENTS

The present invention will be further described in conjunction with the embodiments, which are not intended to limit the scope of the present invention. Any substitute and adjustment based on the present invention made by those skilled in the art shall fall within the scope of the invention.

Example 1

In this embodiment, illustrated is a coating for glass coating, comprising a Cr intermediate layer, a $Cr_xW_yN_{(100-x-y)}$ layer, and Pt nanoparticles which are dispersed in the $Cr_xW_yN_{(100-x-y)}$ layer. In this embodiment, the surface roughness of the coating is 3.47 nm; the atomic percents of the Cr, W, N and Pt elements in the coating are respectively 19.8%, 28.7%, 46.9% and 4.6%. The Pt nanoparticles are dispersed in the nitride matrix with a structure being the columnar crystal. The Cr intermediate layer has a thickness of 100 nm; the CrWN—Pt layer has a thickness of 1010 nm, a hardness of 20.41 GPa and an elastic modulus of 365.7 GPa.

The coating in this embodiment is prepared by a plasma enhanced magnetron sputtering system and the following method. The plasma enhanced magnetron sputtering system comprises a magnetron sputtering control center, a vacuum chamber, a rotary frame arranged in the vacuum chamber and targets arranged around the rotary frame. The targets comprise a high-purity W target, a high-purity Cr target, a precious metal inserted Cr target, and a rotary frame for mounting the substrate. The precious metal inserted Cr target comprises a high-purity Cr target and 6 Pt targets which are uniformly inserted in the high-purity Cr target. Holes are provided at the high-purity Cr target of the precious metal inserted Cr target, and the Pt target is inserted as an insert into the holes of the high-purity Cr target.

This embodiment further provides a preparation method of the coating for glass molding, comprising the following steps.

1) The sputter cleaning is carried out for the substrate and the targets under an inert gas.

Specifically, firstly, the tungsten carbide substrate of WC-8% Co is polished, where the surface roughness of the tungsten carbide substrate is 10±2 nm; and then the polished substrate is subjected to ultrasonic cleaning in deionized water, acetone and ethanol, respectively, where the ultrasonic cleaning lasts 20 minutes each time. Then, the cleaned substrate is dried, and specifically, the substrate is placed in an oven at 80° C. and dried for 20 minutes. Then, the dried substrate is mounted on the rotary frame in a vacuum chamber of a plasma enhanced magnetron sputtering system, and vacuum treatment is performed to allow the vacuum degree of the substrate to be $5\times10^{-3}$ Pa. At the same time, the vacuum chamber is heated at a heating temperature of 350° C. to preheat the substrate to be 350° C. The substrate and the targets are subjected to sputter cleaning to remove the dirt and oxide film on the surface of the substrate, where the time for cleaning the substrate is 100 minutes; the time for cleaning the targets is 10 minutes; during cleaning, the atmosphere in the vacuum chamber is Argon (Ar), and the flow rate is 140 sccm, and the vacuum degree is 0.5 Pa, i.e., during the sputter cleaning, the vacuum degree is 0.5 Pa.

2) In a mixed atmosphere of nitrogen and the inert gas, a high-purity W target, a high-purity Cr target and a precious metal inserted Cr target are adopted to deposit a Cr intermediate layer, a nitride layer and nano precious metal particles on the surface of the substrate.

Specifically, the plasma enhanced magnetron sputtering system is started to firstly deposit the Cr intermediate layer, where a flow rate of argon is 140 sccm; a vacuum degree is 0.4 Pa; a bias voltage for the deposition is −50 V; a deposition time is 3 minutes; a power for the high-purity Cr target is 5 kW; and a rotation speed of the rotary frame is 3 rpm. Then, the nitrogen layer and the nano precious metal particles are deposited, where argon and nitrogen respectively have a flow rate of 100 sccm; a vacuum degree is 0.4 Pa; a bias voltage for the deposition is −50 V; a deposition time is 40 minutes; a power for the targets is 4 kW; a power for the precious metal inserted Cr target is 2.7 kW; and a rotation speed of the rotary frame is 3 rpm. The substrate rotates with the rotary frame in the vacuum chamber during the deposition.

The properties of the glass molding coating prepared using above method of this embodiment are described as follows.

Figure 1:
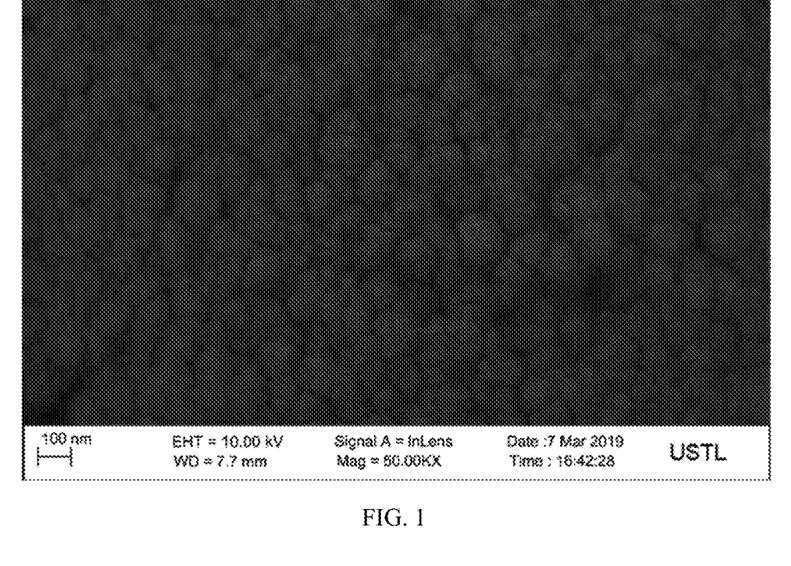
FIG. 1 is an SEM image showing a surface of a coating for glass molding according to a first embodiment of the present invention.
Figure 2:
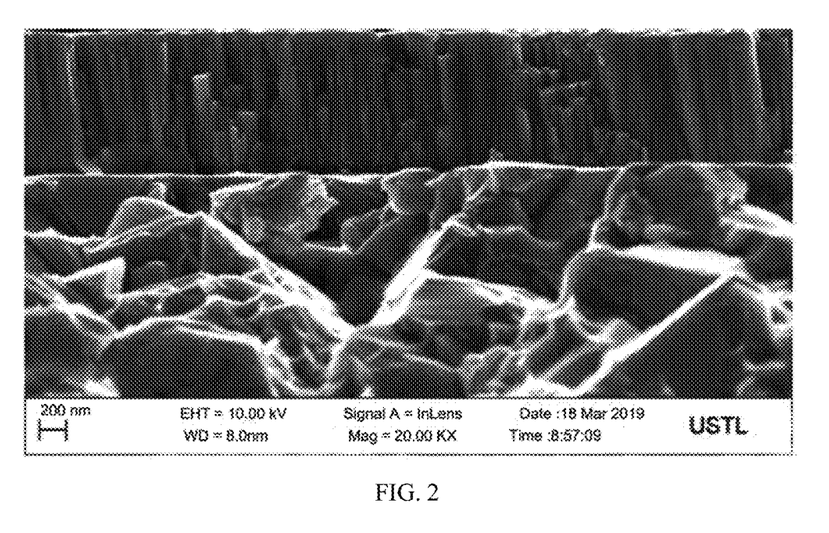
FIG. 2 is an SEM image showing a cross section of the coating according to the first embodiment of the present invention.

The micro-morphologies of the surface and cross section of the glass molding coating are observed by field emission scanning electron microscopy (FESEM). It can be seen that the surface of the coating is fine and cluster-like. As shown in FIG. 1, the cross section of the coating shows a columnar crystal growth structure; the Cr intermediate layer has a thickness of 100 nm, and the CrWN—Pt layer has a thickness of 1010 nm. As shown in FIG. 2, the coating is tightly bonded to the substrate, and no peeling phenomenon occurs, and the columnar crystal structure is fine.

Figure 3:
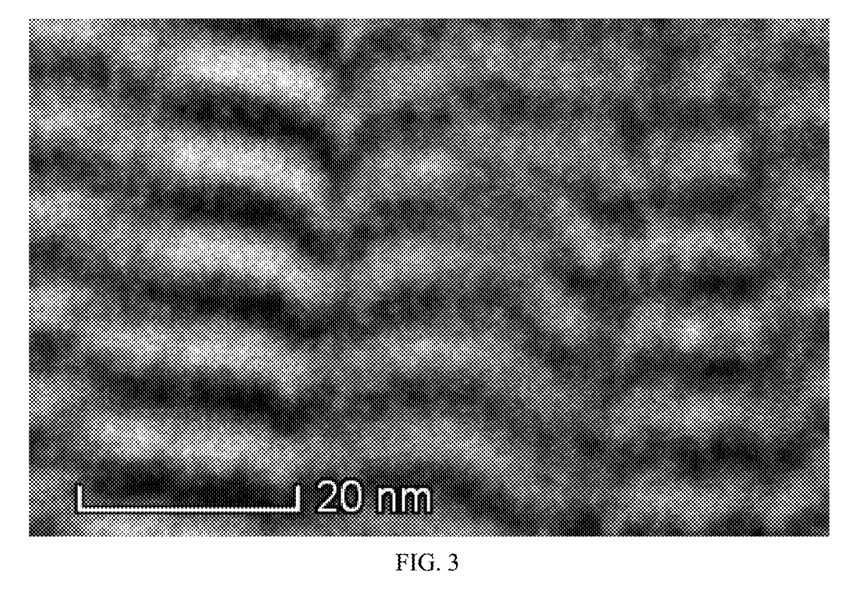
FIG. 3 is a TEM image of the coating according to the first embodiment of the present invention.

The cross sectional structure of the coating is observed using transmission electron microscopy (FEI JEM-3200). As shown in FIG. 3, the WN layer and the CrN layer of the coating are alternately grown, which is in a typical nano-multilayer alternating composite structure, and the precious metal particles (Pt nanoparticles) are dispersed in the coating.

Figure 6:
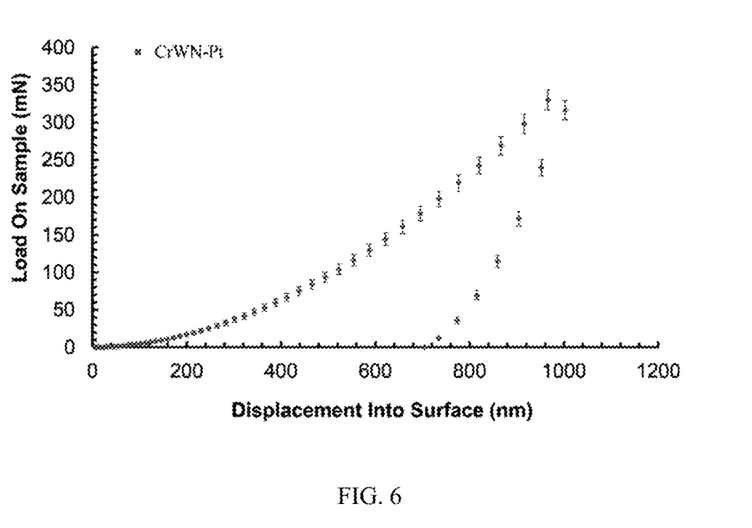
FIG. 6 shows a test result of a hardness of the coating according to the first embodiment of the present invention.

The hardness of the coating is tested by a nanoindenter, and 20 different areas on the sample surface are selected. The hardness and elastic modulus of the sample are averaged using the continuous stiffness mode (CSM). In order to eliminate the influence of the substrate on the hardness of the coating, the hardness value is calculated by selecting a nanoindentation depth of 100 nm. FIG. 6 shows a load-displacement curve obtained by the test. The prepared coating is calculated to have a hardness of 20.41 GPa and an elastic modulus of 365.7 GPa using Oliver-Pharr method.

Figure 5:
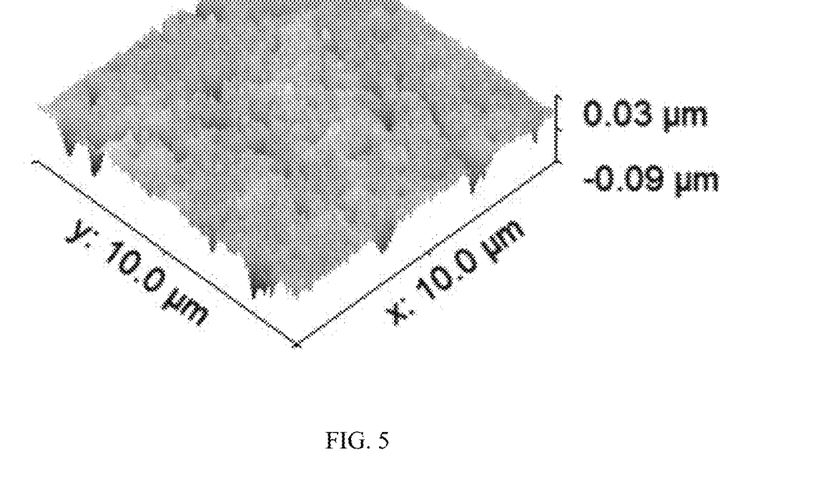
FIG. 5 is an image showing a test result of a roughness of the coating according to the first embodiment of the present invention.

As shown in FIG. 5, the surface roughness of the coating deposited on the tungsten carbide (WC) substrate is measured by the atomic force microscopy (AFM) with a measurement area of 10×10 μm. Results show that the surface roughness of the coating is 3.47 nm.

Figure 4:
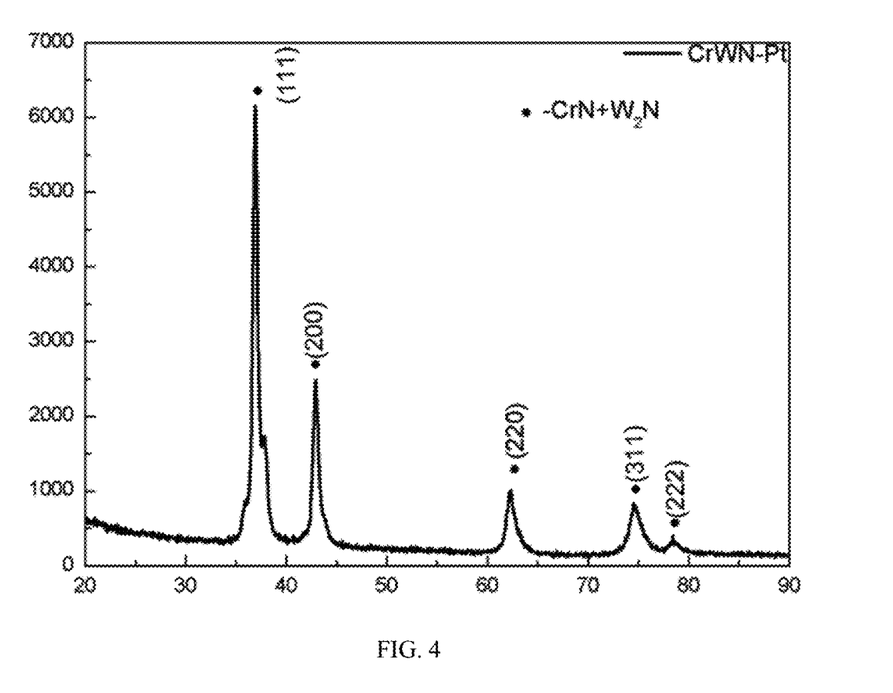
FIG. 4 is an XRD pattern of the coating according to the first embodiment of the present invention.

The phase structure of the coating is analyzed by X-ray diffractometer, and the scanning range is 20-90°. In order to avoid the influence of the substrate on the coating, the grazing angle is set to 1°, and the scanning speed is 5°/min. As shown in FIG. 4, the coating mainly consists of a CrN phase and a $W_2N$ phase, and no precious metal phase (Pt phase) is observed, which is mainly due to a small content of the precious metal.

Figure 7:
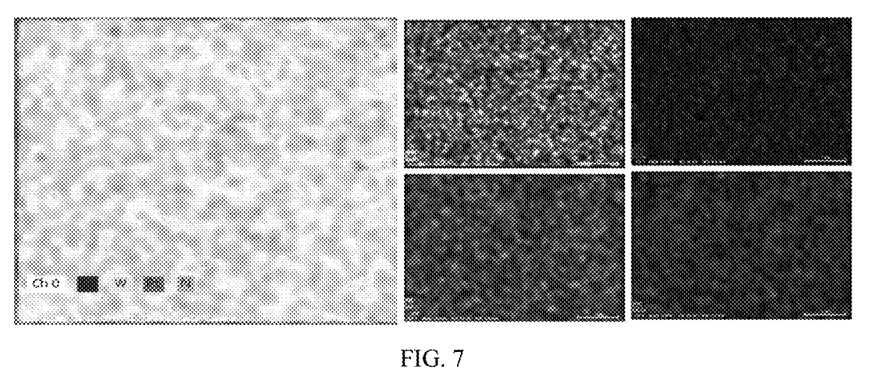
FIG. 7 is an image showing a distribution of elements of the coating according to the first embodiment of the present invention.
Figure 8:
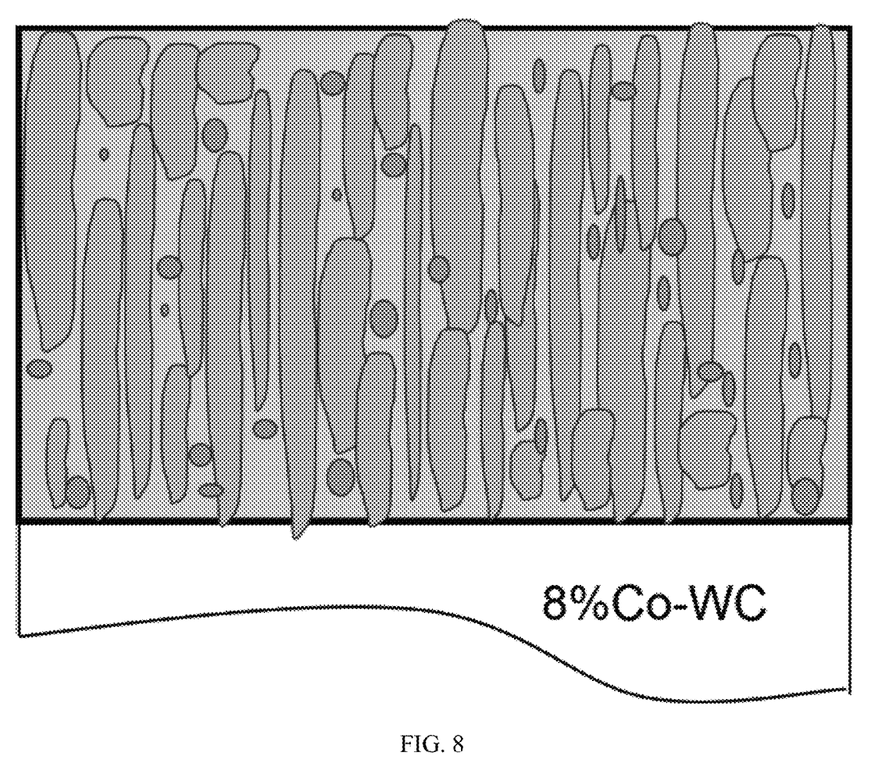
FIG. 8 is a schematic diagram showing a substrate and the coating according to the first embodiment of the present invention.

The distribution of elements in the coating is analyzed by the energy disperse spectroscopy (EDS) of the scanning electron microscopy (SEM). The coating mainly consists of Cr, W, N and Pt elements, where the atomic percents of the Cr, W, N and Pt elements in the coating are 19.8%, 28.7%, 46.9.% and 4.6%, respectively. As shown in FIG. 7, the elements are uniformly distributed, and no agglomeration occurs.

BK7 optical glass is molded by an optical aspherical glass molding apparatus (disclosed in Chinese Patent ZL201610466610X), and the surface of the molding apparatus is deposited with the coating prepared by this embodiment. The molding force and the molding temperature are respectively set to be 0.5 kN and 650° C. After the molding, the coating on the mold and the surface morphology and color of the BK7 glass are observed. On the one hand, for the coating on the mold, no peeling and adhesion occurs; on the other hand, the glass element suffers no color change, and no bubble is generated.

Example 2

In this embodiment, illustrated is a coating for glass molding, comprising a Cr intermediate layer, a $Cr_xW_yN_{(100-x-y)}$ layer, and Pt and Ir nanoparticles which are dispersed in the $Cr_xW_yN_{(100-x-y)}$ layer.

In this embodiment, the surface roughness of the glass molding coating is 5.741 nm; the atomic percents of the Cr, W, N, Pt and Ir elements in the coating are respectively 22.3%, 27.96%, 44.72%, 3.5% and 1.52%. The Pt and Ir nanoparticles are dispersed in the nitride matrix being the columnar crystal structure. The Cr intermediate layer has a thickness of 111 nm; the CrWN—PtIr layer has a thickness of 932 nm, a hardness of 18.27 GPa and an elastic modulus of 342.1 GPa.

The coating in this embodiment is prepared by a plasma enhanced magnetron sputtering system and the following method. The plasma enhanced magnetron sputtering system comprises a magnetron sputtering control center, a vacuum chamber, a rotary frame arranged in the vacuum chamber and targets arranged around the rotary frame. The targets comprise a high-purity W target, a high-purity Cr target, a precious metal inserted Cr target, and a rotary frame for mounting the substrate. The precious metal inserted Cr target comprises a high-purity Cr target, 6 Pt targets and 3 Ir targets which are uniformly inserted in the high-purity Cr target.

This embodiment further provides a preparation method of the coating for glass molding, comprising the following steps.

1) The sputter cleaning is carried out for the substrate and the targets under an inert gas.

Specifically, firstly, the tungsten carbide substrate of WC-8% Co is polished, where the surface roughness of the tungsten carbide substrate is 10±2 nm; and then the polished substrate is subjected to ultrasonic cleaning in deionized water, acetone and ethanol, respectively, where the ultrasonic cleaning lasts 20 minutes each time. Then, the cleaned substrate is dried, and specifically, the substrate is placed in an oven at 80° C. and dried for 20 minutes. Then, the dried substrate is mounted on the rotary frame in a vacuum chamber of a plasma enhanced magnetron sputtering system, and vacuum treatment is performed to allow the vacuum degree of the substrate to be $5 \times 10^{-3}$ Pa. At the same time, the vacuum chamber is heated at a heating temperature of 350° C. to preheat the substrate to be 350° C. The substrate and the targets are subjected to sputter cleaning to remove the dirt and oxide film on the surface of the substrate, where the time for cleaning the substrate is 100 minutes; the time for cleaning the targets is 10 minutes; during cleaning, the atmosphere in the vacuum chamber is Argon (Ar), and the flow rate is 140 sccm, and the vacuum degree is 0.5 Pa, i.e., during the sputter cleaning, the vacuum degree is 0.5 Pa.

2) In a mixed atmosphere of nitrogen and the inert gas, a high-purity W target, a high-purity Cr target and a precious metal inserted Cr target are adopted to deposit a nitride layer and nano precious metal particles on the surface of the substrate.

Specifically, the plasma enhanced magnetron sputtering system is started to firstly deposit the Cr intermediate layer, where a flow rate of argon is 140 sccm; a vacuum degree is 0.4 Pa; a bias voltage for the deposition is −50 V; a deposition time is 3 minutes; a power for the high-purity Cr target is 5 kW; and a rotation speed of the rotary frame is 3 rpm. Then, the nitrogen layer and the nano precious metal particles are deposited, where argon and nitrogen respectively have a flow rate of 100 sccm; a vacuum degree is 0.4 Pa; a bias voltage for the deposition is −50 V; a deposition time is 40 minutes; a power for the targets is 4 kW; a power for the precious metal inserted Cr target is 2.7 kW; and a rotation speed of the rotary frame is 3 rpm. The substrate rotates with the rotary frame in the vacuum chamber during the deposition.

The properties of the glass molding coating prepared using above method of this embodiment are described as follows.

Figure 9:
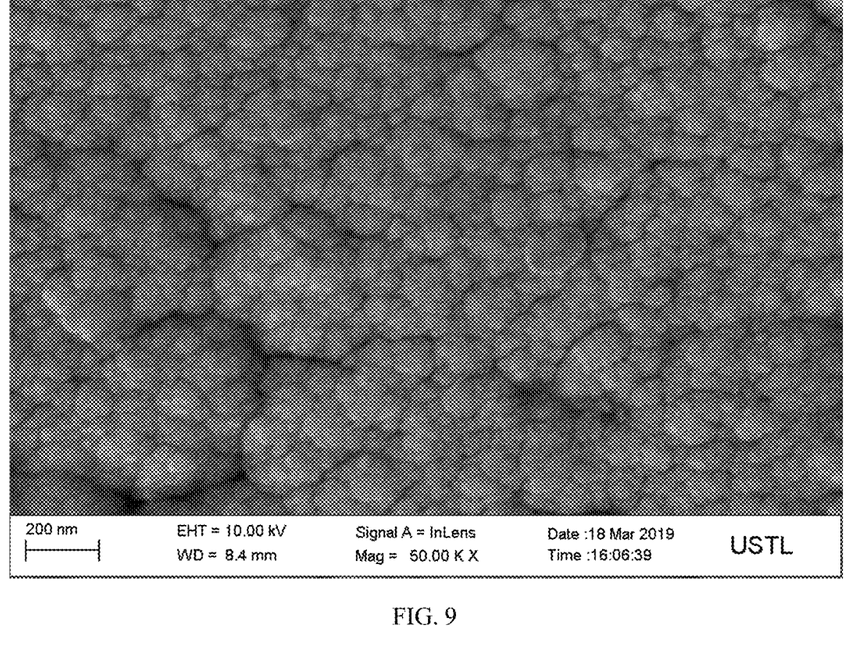
FIG. 9 is an SEM image showing the surface of the coating according to a second embodiment of the present invention.
Figure 10:
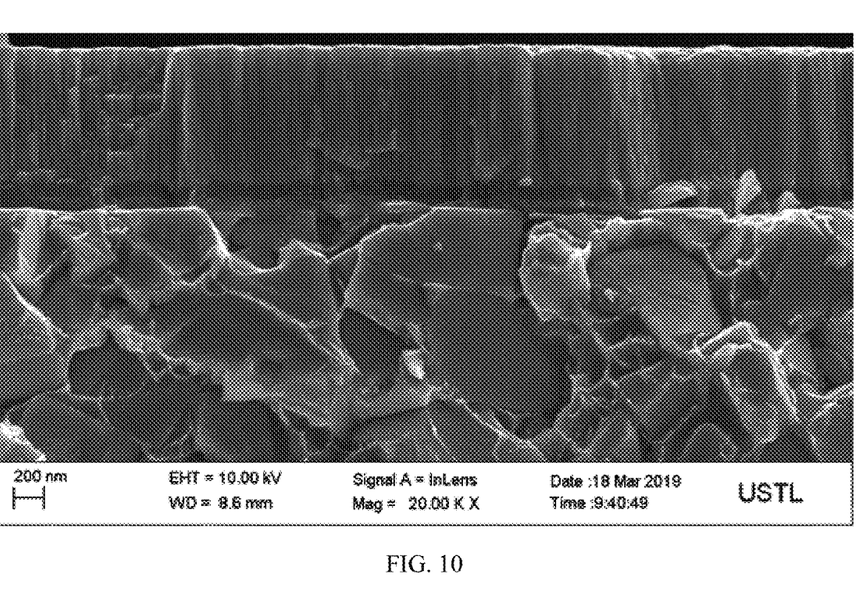
FIG. 10 is an SEM image showing the cross section of the coating according to the second embodiment of the present invention.

The micro-morphology of the surface and cross section of the glass molding coating are observed by field emission scanning electron microscopy (FESEM). It can be seen that the surface of the coating is fine and cluster-like. As shown in FIG. 9, the cross section of the coating shows a columnar crystal growth structure; the Cr intermediate layer has a thickness of 111 nm, and the CrWN—PtIr layer has a thickness of 932 nm. As shown in FIG. 10, the coating is tightly bonded to the substrate, and no peeling phenomenon occurs, and the columnar crystal structure is fine.

Figure 11:
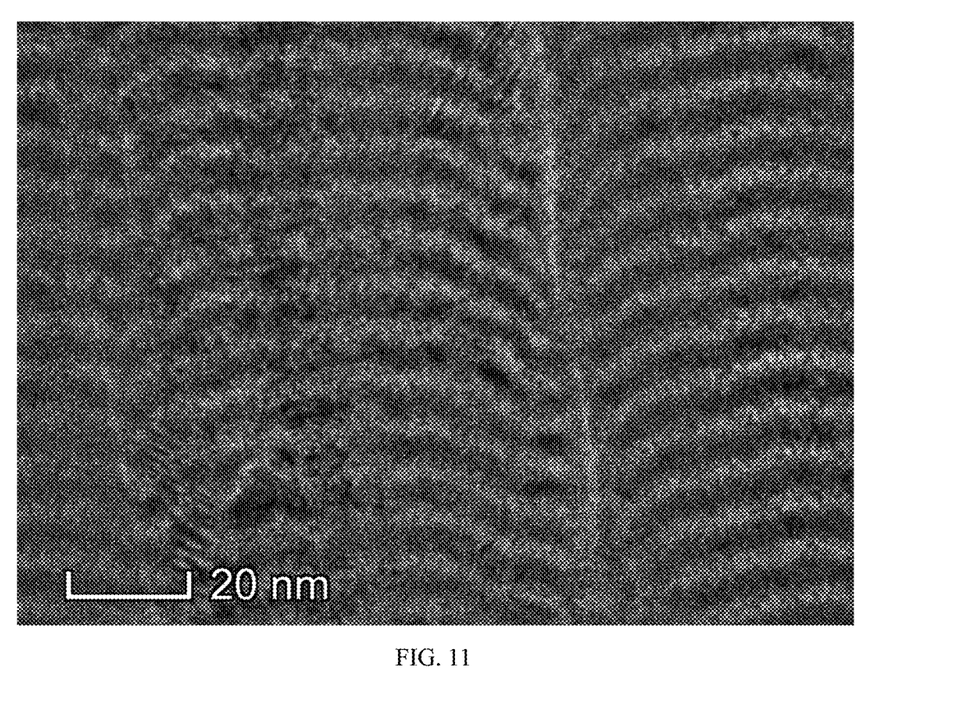
FIG. 11 is a TEM image of the coating according to the second embodiment of the present invention.

The cross sectional structure of the coating is observed using transmission electron microscopy (FEI JEM-3200). As shown in FIG. 11, the WN layer and the CrN layer of the coating are alternately grown, which is a typical nano-multilayer alternating composite structure, and the precious metal particles (Pt—Ir nanoparticles) are dispersed in the coating. FIG. 9 is a cross section of the substrate and the coating.

Figure 14:
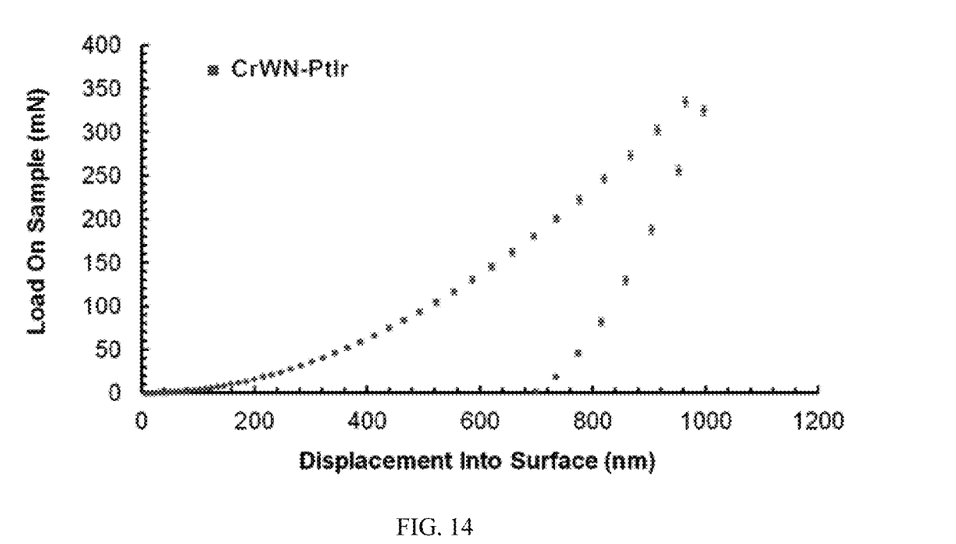
FIG. 14 shows a test result of the hardness of the coating according to the second embodiment of the present invention.

The hardness of the coating is tested by a nanoindenter, and 20 different areas on the sample surface are selected. The hardness and elastic modulus of the sample are averaged using the continuous stiffness mode (CSM). In order to eliminate the influence of the substrate on the hardness of the coating, the hardness value is calculated by selecting a nanoindentation depth of 100 nm. FIG. 14 shows a load-displacement curve obtained by the test. The prepared coating is calculated to have a hardness of 18.27 GPa and an elastic modulus of 342.1 GPa using Oliver-Pharr method.

Figure 13:
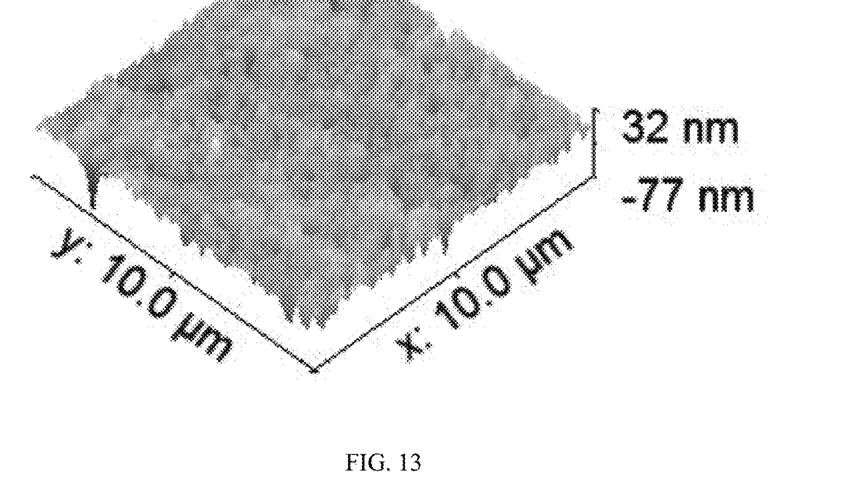
FIG. 13 is an image showing a test result of the roughness of the coating according to the second embodiment of the present invention.

As shown in FIG. 13, the surface roughness of the coating deposited on the tungsten carbide (WC) substrate is measured by the atomic force microscopy (AFM) with a measurement area of 10×10 µm. Results show that the surface roughness of the coating is 5.741 nm.

Figure 12:
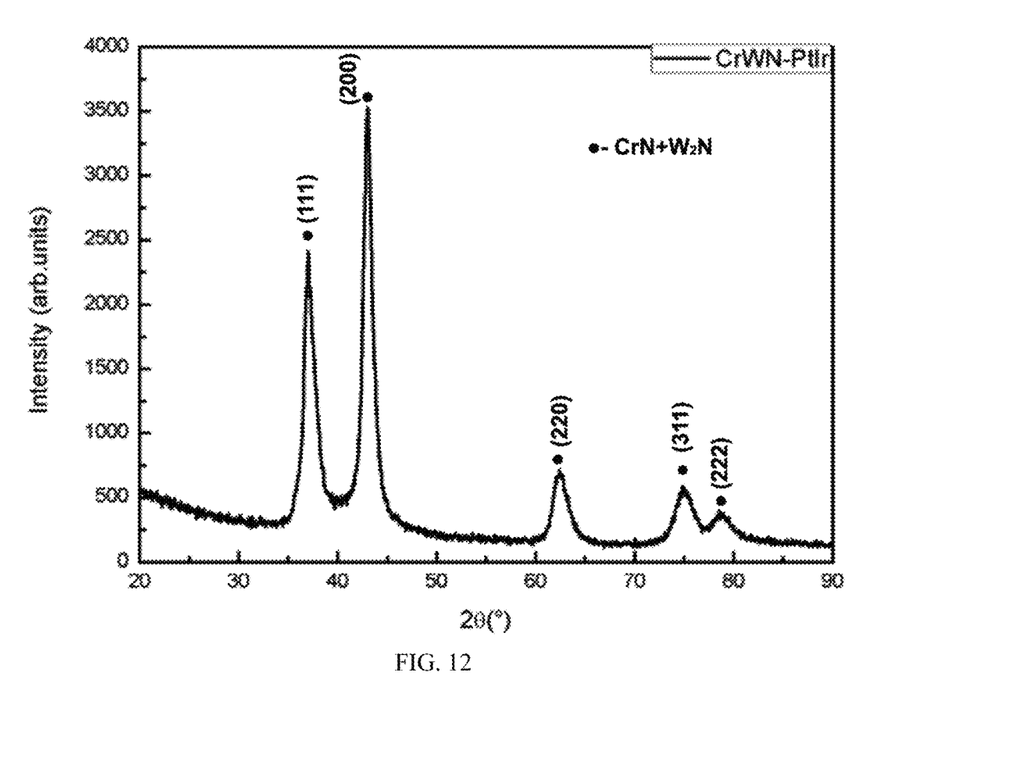
FIG. 12 is an XRD pattern of the coating according to the second embodiment of the present invention.

The phase structure of the coating is analyzed by X-ray diffractometer, and the scanning range is 20-90°. In order to avoid the influence of the substrate on the coating, the grazing angle is set to 1°, and the scanning speed is 5°/min. As shown in FIG. 12, the coating mainly consists of a CrN phase and a $W_2N$ phase, and no precious metal phase (Pt or Ir phase) is observed, which is mainly due to a small content of the precious metal.

Figure 15:
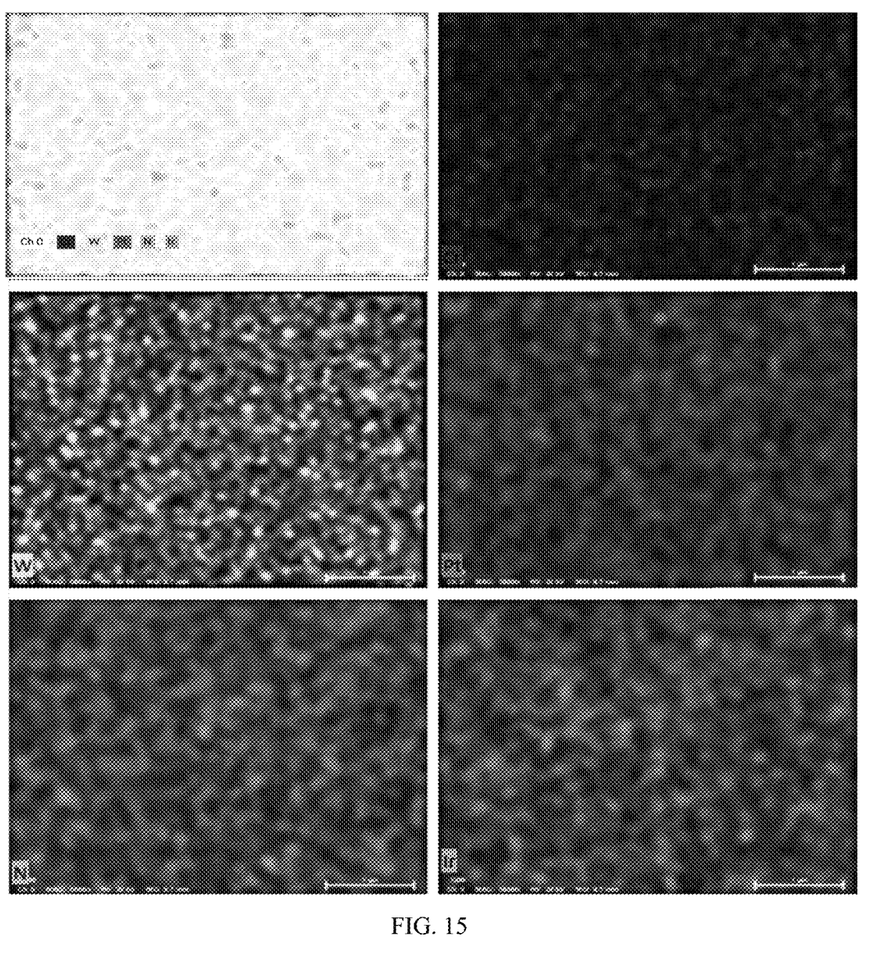
FIG. 15 is an image showing the distribution of elements of the glass molding coating according to the second embodiment of the present invention.

The distribution of elements in the coating is analyzed by the energy disperse spectroscopy (EDS) of the scanning electron microscopy (SEM). The coating mainly consists of Cr, W, N, Pt and Ir elements, where the atomic percents of the Cr, W, N, Pt and Ir elements in the coating are 22.3%, 27.96%, 44.72%, 3.5% and 1.52%, respectively. The elements are uniformly distributed, and no agglomeration occurs, as shown in FIG. 15.

BK7 optical glass is molded by an optical aspherical glass molding apparatus (disclosed in Chinese Patent ZL201610466610X), and the molding apparatus is deposited with the coating prepared by this embodiment on the surface. The molding pressure and the molding temperature are respectively set to be 0.5 kN and 650° C. After the molding, the coating on the mold and the surface morphology and color of the BK7 glass are observed. On the one hand, for the coating on the mold, no peeling and adhesion occurs; on the other hand, the glass element suffers no color change, and no bubble is generated. The surface roughness of the coating before and after molding was measured by a profiliometer. It is found that the surface roughness of the coating before and after molding is stable, no obvious increase occurs.

Example 3

The coating is deposited on a silicon wafer, and after the deposition, the surface roughness of the coating is measured by atomic force microscopy (AFM) with a measurement area of 10×10 µm. The result shows that the surface roughness of the coating is 1.6-2.3 nm.

In summary, the coating prepared in the embodiment can have a hardness of 18.27-24.32 GPa and an elastic modulus of 280-413 GPa, and the surface roughness of the coating can reach 2-11.73 nm. The coating of the present invention has good oxidation resistance and excellent anti-adhesion property, and can effectively inhibit the adhesion between the glass body and the mold. As observed by the scanning electron microscopy, the glass molding coating of the present invention has a fine columnar crystal growth structure, and the coating is tightly bonded to the substrate, and the crystals doped on the surface of the coating are fine and clustered. As observed by transmission electron microscopy, the WN layer and the CrN layer of the glass mold coating are alternately grown, and the nano precious metal particles are uniformly dispersed in the coating. The distribution of elements in the coating is analyzed using the energy spectrometer provided by scanning electron microscopy, and the elements are uniformly distributed, and no agglomeration phenomenon occurs. BK7 optical glass precision molding is carried out using a glass molding mold containing the coating of the present invention, where the molar force is 0.5 kN, and the molding temperature is 650° C. After molding, the mold coating and the morphology and color of the glass surface are observed, where for the coating, no peeling or adhesion occurs; and the glass element has no color change, and no bubble is generated.

Example 4

A coating for glass molding is provided in this embodiment. This embodiment is similar to Example 1 except that the nano precious metal particles in this embodiment are Au nano particles. The present embodiment has the same preparation method for the glass molding coating with Example 1.

Example 5

A coating for glass molding is provided in this embodiment. This embodiment is similar to Example 2 except that the nano precious metal particles in this embodiment are Pt—Au nano particles. This embodiment has the same preparation method for the coating with Example 2.

Example 6

A coating for glass molding is provided in this embodiment. This embodiment is similar to Example 2 except that the nano precious metal particles in this embodiment are Pt—Ir nano particles. This embodiment has the same preparation method for the coating with Example 2.

Example 7

A coating for glass molding is provided in this embodiment. This embodiment is similar to Example 1 except that the nano precious metal particles in this embodiment are Au—Ir nano particles. This embodiment has the same preparation method for the coating with Example 1.

Example 8

A coating for glass molding is provided in this embodiment. This embodiment is similar to Example 1 except that the nano precious metal particles in this embodiment are Pt—Au—Ir nano particles. This embodiment has the same preparation method for the coating with Example 1.

Example 9

This embodiment provides a precious molding mold, and a surface of the mold is applied with the coating prepared in Example 1 or 2.

Example 10

This embodiment provides an application of the coating prepared in Example 1 or 2 in high temperature resistant materials, such as materials for cutting tools, engine piston rings and molds for lens arrays, and the coating on the high temperature resistant material is prepared according to Example 1 or 2.

Example 11

This embodiment provides an application of the coating prepared in Example 1 or 2 in oxidation-resistance materials, such as materials for heat exchanger components and pipes in exhaust systems.

Example 12

This embodiment provides an application of the coating prepared in Example 1 or 2 in anti-adhesion materials, such as materials for molds or containers for glass, plastics and asphalt.

We claim:

1. A coating for glass molding, comprising:
a nitride layer and nano precious metal particles which are dispersed in the nitride layer;
wherein the nitride layer is a $Cr_xW_yN_{(100-x-y)}$ layer, wherein $15<x<40$, $15<y<40$;
wherein the nano precious metal particles are Au.

2. The coating of claim 1, wherein a surface roughness of the coating is 2-12 nm.

3. The coating of claim 2, wherein a surface roughness of the coating is 3-5 nm.

4. The coating of claim 1, wherein an atomic percent of the nano precious metal particles in the nitride layer including the nano precious metal particles is 1-10%.

5. The coating of claim 4, wherein a cross section of the coating shows a columnar crystal growth structure, and the nano precious metal particles are dispersed in the columnar crystal growth structure.

6. The coating of claim 5, wherein the coating has a thickness of 0.8-1.2 μm and a hardness of 15-25 Gpa.

7. The coating of claim 6, wherein the nitride layer is a multi-component nanocomposite nitride coating.

8. The coating of claim 1, wherein target materials for forming the coating comprise a precious metal inserted Cr target, the precious metal inserted Cr target comprises a high-purity Cr target and a precious metal target, and the precious metal target is an Au target, and is uniformly inserted at the high-purity Cr target.

9. The coating of claim 8, wherein the $Cr_xW_yN_{(100-x-y)}$ layer has a nano-multilayer alternating composite structure formed by alternately grown WN layer and CrN layer.

10. A precious mold die for compression molding comprising the coating of claim 1.

11. A high-temperature resistant material comprising the coating of claim 1.

12. An oxidation-resistance material comprising the coating of claim 1.

13. An anti-adhesion material comprising the coating of claim 1.

* * * * *